(12) United States Patent
Starnes

(10) Patent No.: US 7,397,722 B1
(45) Date of Patent: Jul. 8, 2008

(54) MULTIPLE BLOCK MEMORY WITH COMPLEMENTARY DATA PATH

(75) Inventor: Glenn E. Starnes, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 6 days.

(21) Appl. No.: 11/670,632

(22) Filed: Feb. 2, 2007

(51) Int. Cl.
*G11C 7/00* (2006.01)

(52) U.S. Cl. ............................. 365/230.03; 365/189.05; 365/190; 365/203

(58) Field of Classification Search .................. 365/204
See application file for complete search history.

(56) References Cited

U.S. PATENT DOCUMENTS

| | | | | |
|---|---|---|---|---|
| 4,656,610 A | * | 4/1987 | Yoshida et al. | 365/189.07 |
| 5,337,283 A | * | 8/1994 | Ishikawa | 365/222 |
| 5,367,488 A | * | 11/1994 | An | 365/189.18 |
| 5,706,229 A | * | 1/1998 | Yabe et al. | 365/189.05 |
| 6,101,145 A | | 8/2000 | Nicholes | |
| 6,236,619 B1 | * | 5/2001 | Cho et al. | 365/233.16 |
| 6,462,999 B1 | * | 10/2002 | Amano | 365/205 |

* cited by examiner

*Primary Examiner*—Tan T. Nguyen
(74) *Attorney, Agent, or Firm*—Ranjeev Singh; James L. Clingan, Jr.

(57) ABSTRACT

A memory has a first memory block, a second memory block, a data bus, a first sense amplifier, a second sense amplifier, a first circuit, and a second circuit. The first sense amplifier is coupled to the first memory block. The second sense amplifier is coupled to the second memory block. The first circuit is coupled to the data bus and the first sense amplifier. The first circuit switches from precharging the data bus to providing data when the first memory block is selected and is decoupled from the data bus in response to the first memory block being deselected. The second circuit is coupled to the data bus and the second sense amplifier. The second circuit switches from precharging the data bus to providing data when the second memory block is selected and is decoupled from the data bus in response to the second memory block being deselected.

20 Claims, 4 Drawing Sheets

MULTIPLE BLOCK MEMORY WITH COMPLEMENTARY DATA PATH

BACKGROUND

1. Field

This disclosure relates generally to memory, and more specifically, to a multiple block memory with complementary data path.

2. Related Art

In certain instances, memory is designed by combining several memory blocks to satisfy the requirements imposed by a system designer. These requirements may relate to constraints, such as the number of blocks, the number of I/O data paths, the number of rows per block, word length, process, voltage, temperature, and timing constraints. A memory designer may design memory blocks that may satisfy these constraints individually. When several memory blocks are combined to form a memory, however, these constraints may create timing problems. Specifically, for example, in such memories, data read from sense amplifiers corresponding to the memory blocks is latched in a global data hold latch. The global data hold latch is used to hold data indefinitely. The global data hold latch must tri-state just prior to the sense amplifier driver is activated. Global data hold latch must re-activate prior to the sense amplifier is tri-stated. These timing constraints are typically managed using global timing controls. Managing the timing relationship of the global data hold latch and the sense amplifier is difficult, however, across different requirements associated with the memory. Accordingly, there is a need for a multiple block memory with complementary data path.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
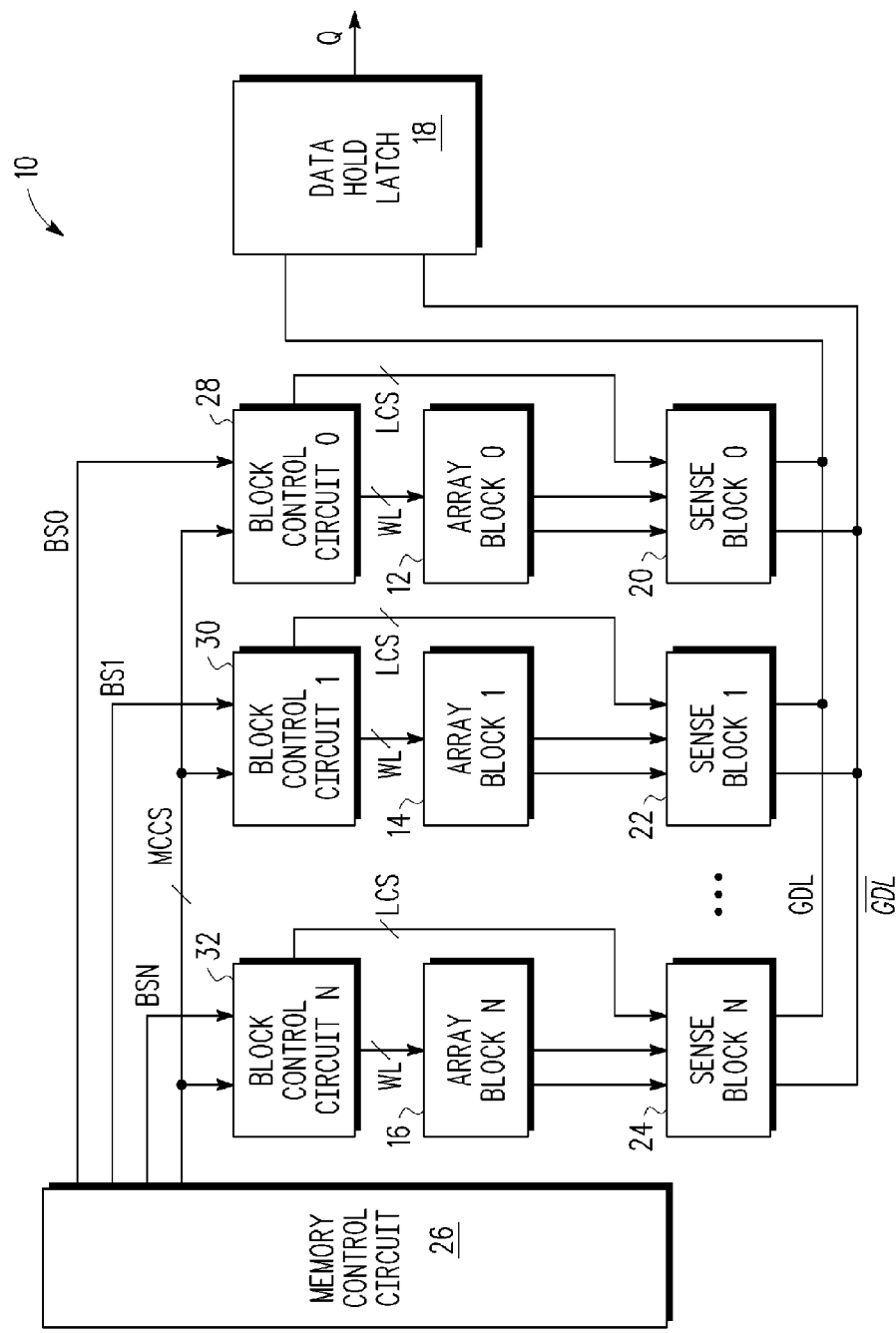
FIG. 1 is an exemplary block diagram of a multiple block memory with complementary data path.

In one aspect, a memory including a first memory block, a second memory block, a data bus, a first sense amplifier, a second sense amplifier, a first circuit, and a second circuit is provided. The first sense amplifier is coupled to the first memory block. The second sense amplifier is coupled to the second memory block. The first circuit is coupled to the data bus and the first sense amplifier. The first circuit switches from precharging the data bus to providing data in response to a first sense enable signal when the first memory block is selected and is decoupled from the data bus in response to the first memory block being deselected. The second circuit is coupled to the data bus and the second sense amplifier. The second circuit switches from precharging the data bus to providing data in response to a second sense signal when the second memory block is selected and is decoupled from the data bus in response to the second memory block being deselected.

In another aspect, a method of operating memory having a data bus, a first memory block, a second memory block, a first sense amplifier coupled to the first memory block, a second sense amplifier coupled to the second memory block, a first circuit coupled between the first sense amplifier and the data bus, and a second circuit coupled between the second sense amplifier and the data bus, is provided. The method includes precharging the data bus through the first and second circuit. The method further includes selecting the first memory block and deselecting the second memory block in response to a clock signal. The method further includes terminating precharging the data bus through second circuit while maintaining precharging of the data bus through first circuit. The method further includes providing data from the first memory block to the data bus through the first circuit and terminating precharging of the data bus through the first circuit in response to a first sense enable signal.

In yet another aspect, a memory including a first memory block enabled in response to a first block select signal and having complementary outputs, a second memory block enabled in response to a second block select signal and having complementary outputs, and a data bus having a true line and a complementary line, is provided. The memory further includes a first sense amplifier coupled to the complementary outputs of the first memory block, having a clock input responsive to a first sense enable signal, and having complementary outputs and a second sense amplifier coupled to complementary outputs of the second memory block, having a clock input responsive to a second sense enable signal, and having complementary outputs. The memory further includes a first tri-driver coupled to the complementary outputs of the first sense amplifier, having a clock input responsive to the first sense enable signal, and having complementary outputs coupled to the data bus on which is selected for performance by the first tri-driver one of the group consisting of precharging the data bus, providing a high impedance to the data bus, and providing complementary data on the data bus. The memory further includes a second tri-driver coupled to the complementary outputs of the second sense amplifier, having a clock input responsive to the second sense enable signal, and having complementary outputs coupled to the data bus on which is selected for performance by the second tri-driver one of the group consisting of precharging the data bus, providing a high impedance to the data bus, and providing complementary data on the data bus.

As used herein, the term "bus" is used to refer to a plurality of signals or conductors which may be used to transfer one or more various types of information, such as data, addresses, control, or status. The conductors as discussed herein may be illustrated or described in reference to being a single conductor, a plurality of conductors, unidirectional conductors, or bidirectional conductors. However, different embodiments may vary the implementation of the conductors. For example, separate unidirectional conductors may be used rather than bidirectional conductors and vice versa. Also, plurality of conductors may be replaced with a single conductor that transfers multiple signals serially or in a time multiplexed manner. Likewise, single conductors carrying multiple signals may be separated out into various different conductors carrying subsets of these signals. Therefore, many options exist for transferring signals.

The terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Each signal described herein may be designed as positive or negative logic, where negative logic is indicated by a bar over the signal name. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

FIG. 1 is an exemplary block diagram of a multiple block memory 10 with complementary data path. Multiple block memory 10 may include several memory array blocks, including, for example, array block 0 12, array block 1 14, and array block N 16. Each of these blocks may further have a corresponding sense block, such as sense block 0 20, sense block 1 22, and sense block N 24. Each of the sense blocks may be coupled to a data bus, including a true global data line GDL and a complementary global data line $\overline{GDL}$. The true global data line GDL and the complementary global data line $\overline{GDL}$ may be coupled to a data hold latch 18, which may latch an output Q representative of the data on the data bus. Each memory block may further be coupled to a block control circuit, including, for example, block control circuit 0 28, block control circuit 1 30, and block control circuit N 32. In addition, a memory control circuit 26 may be coupled to each of the block control circuits. Memory control circuit 26 may provide various control signals MCCS to the block control circuits and may further provide block select signals BS0, BS1, and BSN, for example. Block control circuits may provide WL signals to memory array blocks. Block control circuits may further provide local control signals (LCS) to sense blocks. Although FIG. 1 shows a specific arrangement of the various components of multiple block memory 10, these components may be arranged differently.

Figure 2:
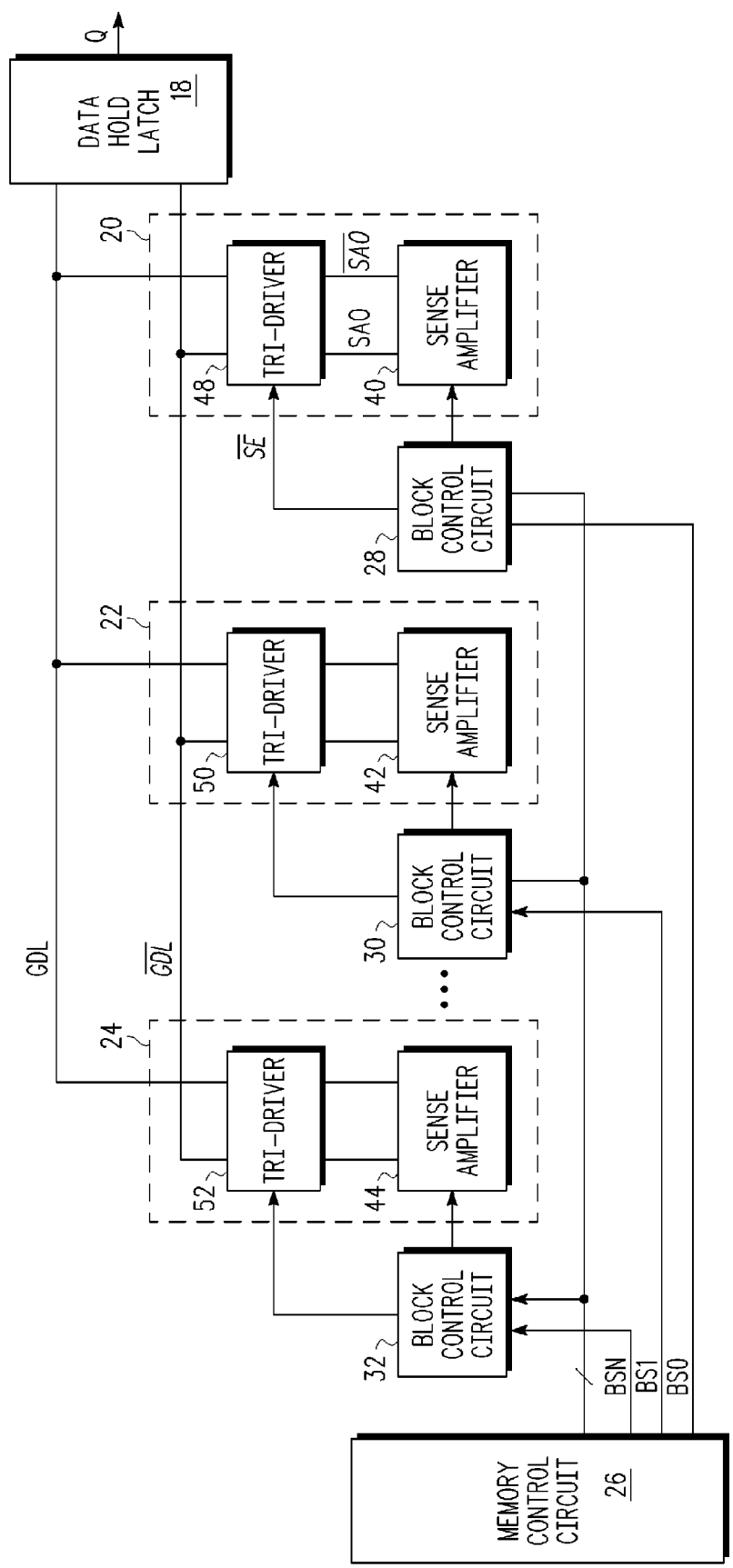
FIG. 2 is an exemplary block diagram illustrating additional details of the multiple block memory of FIG. 1, including details corresponding to a sense amplifier block.

FIG. 2 is an exemplary block diagram illustrating additional details of the multiple block memory of FIG. 1, including details corresponding to the sense amplifier block. By way of example, sense amplifier block 0 20 may include a sense amplifier 40 and a tri-driver 48. Sense amplifier 40 may provide sense amplifier outputs SAO and $\overline{SAO}$. Block control circuit 0 28 may provide a complementary sense enable signal $\overline{SE}$ and other local selection signals to tri-driver 48. Like sense amplifier block 0 20, sense amplifier block 1 22 may also include a sense amplifier 42 and a tri-driver 50. Additionally, like sense amplifier block 0 20, sense amplifier block N 24 may also include a sense amplifier 44 and a tri-driver 52. Tri-drivers 48, 50, and 52 can be used to pre-charge data bus, including true and complementary global data lines GDL and $\overline{GDL}$. Tri-drivers 48, 50, and 52 have two outputs, a first output that couples a voltage supply to the true global data line GDL and a second output that couples the voltage supply to the complementary global data line $\overline{GDL}$ during precharging. These same outputs are used to provide complementary data to the true global data line GDL and the complementary global data line $\overline{GDL}$ when providing data to the data bus. Tri-diver 48 switches from pre-charging the data bus to providing data in response to complementary sense enable signal $\overline{SE}$ when memory block 0 12 is selected. Tri-driver 48, however, is decoupled from the data bus in response to memory block 0 12 being deselected. Tri-driver 50 switches from pre-charging the data bus to providing data in response to complementary sense enable signal $\overline{SE}$ when memory block 1 14 is selected. Tri-driver 50, however, is decoupled from the data bus in response to memory block 1 14 being deselected. Tri-driver 52 switches from pre-charging the data bus to providing data in response to complementary sense enable signal $\overline{SE}$ when memory block N 16 is selected. Tri-driver 52, however, is decoupled from the data bus in response to memory block N 16 being deselected.

Figure 3:
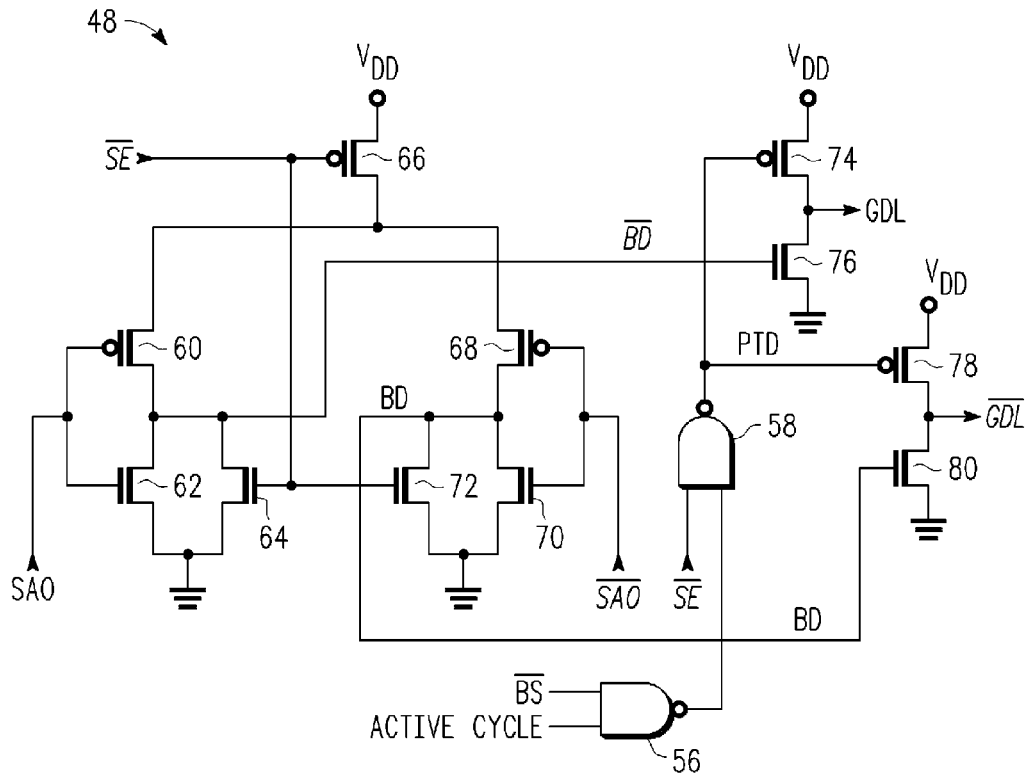
FIG. 3 is an exemplary circuit diagram of a tri-driver of the sense amplifier block.

FIG. 3 is an exemplary circuit diagram of tri-driver 48 of sense block 0 20 of FIGS. 1 and 2. By way of example, tri-driver 48 may include two NOR gates, implemented using a shared P-channel transistor 66. First NOR gate may include a P-channel transistor 60, and two N-channel transistors 62 and 64 coupled to P-channel transistor 60. In particular, the gate of P-channel transistor 66 may be coupled to complementary sense enable signal $\overline{SE}$. The source of P-channel transistor 66 may be coupled to the voltage supply VDD. The drain of P-channel transistor 66 may be coupled to the source of P-channel transistor 60. The drain of P-channel transistor 60 may be coupled to the drain of N-channel transistor 62 and the drain of N-channel transistor 64. The source of N-channel transistor 62 and the source of N-channel transistor 64 may be coupled to ground. The gate of P-channel transistor 60 and the gate of N-channel transistor 62 may be coupled together to receive the sense amplifier output SAO signal. Second NOR gate may include a P-channel transistor 68, and two N-channel transistors 70 and 72 coupled to P-channel transistor 68. The drain of P-channel transistor 66 may be coupled to the source of P-channel transistor 68. The drain of P-channel transistor 68 may be coupled to the drain of N-channel transistor 70 and the drain of N-channel transistor 72. The source of N-channel transistor 70 and the source of N-channel transistor 72 may be coupled to ground. The gate of P-channel transistor 68 and the gate of N-channel transistor 70 may be coupled together to receive the complementary sense amplifier output signal $\overline{SAO}$. First NOR gate and second NOR gate may generate signals complementary buffer data $\overline{BD}$ and buffer data BD, respectively. Tri-driver 48 may further include a NAND gate 58 having a first input coupled to complementary sense enable signal $\overline{SE}$ and a second input coupled to and output of a NAND gate 56, which may receive at its first input ACTIVE CYCLE signal and at its second input complementary block select signal $\overline{BS}$. Tri-driver 48 may further include a P-channel transistor 74 and an N-channel transistor 76. Tri-driver 48 may further include a P-channel transistor 78 and an N-channel transistor 80. The source of P-channel transistors 74 and 78 may be coupled to the voltage supply VDD. The gates of P-channel transistors 74 and 78 may be coupled to the output of NAND gate 58. The drain of P-channel transistor 74 may be coupled to the drain of N-channel transistor 76 forming a node connected to true global data line GDL. The drain of P-channel transistor 78 may be coupled to the drain of N-channel transistor 80 forming a node connected to the complementary global data line $\overline{GDL}$. The sources of N-channel transistors 76 and 80 may be coupled to ground. The gate of N-channel transistor 76 may be coupled to signal $\overline{BD}$ and the gate of N-channel transistor 80 may be coupled to signal BD. Although not described in detail, tri-drivers 50 and 52 may be implemented using the same circuit as the one described for tri-driver 48. In addition, although the tri-drivers described above use active-low logic, they may be implemented using active-high logic, as well. Moreover, although tri-driver 48 is described as having a shared P-channel transistor 66, tri-driver 48 may have separate P-channel transistors, as well.

Figure 4:
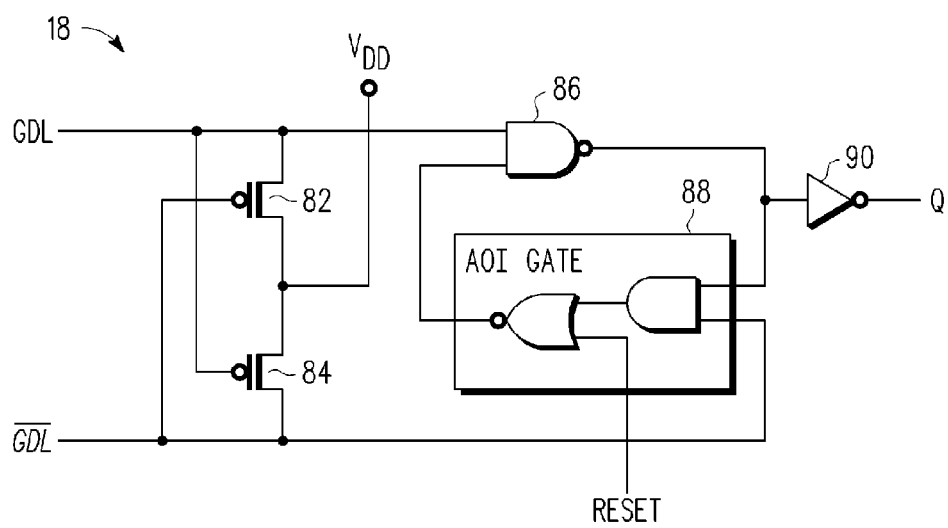
FIG. 4 is an exemplary circuit diagram of a data hold latch for the multiple block memory of FIG. 1.

FIG. 4 is an exemplary circuit diagram of data hold latch 18 of the multiple block memory of FIG. 1. The data hold latch is used to latch, drive, and retain the most recent read data state. Data hold latch 18 may include two cross-coupled P-channel transistors 82 and 84. Data hold latch 18 may further include a NAND gate 86 and an AOI gate 88. As shown in FIG. 4, the drain of P-channel transistor 82 may be coupled to the true global data line GDL and the gate of P-channel transistor 82 may be coupled to the complementary global data line $\overline{GDL}$. The source of P-channel transistor 82 may be coupled to the voltage supply VDD. The gate of P-channel transistor 84 may be coupled to the true global data line GDL, the source of the P-channel transistor 84 may be coupled to the voltage supply VDD, and the drain of P-channel transistor 84 may be coupled to the complementary global data line $\overline{GDL}$. A first input of NAND gate 86 may be coupled to the true global data line GDL and a second input of NAND gate 86 may be coupled to an output of AOI gate 88. The output of NAND gate 86 may be coupled to an inverter 90, which may provide data output Q. The output of NAND gate 86 may further be coupled to a first input of AOI gate 88 and the complementary global data line $\overline{GDL}$ may be coupled to the second input of AOI gate 88. AOI gate 88 may be an AND function and a NOR function coupled in the manner shown in FIG. 4. A reset input RESET may be coupled to one of the inputs of NOR gate. RESET input may help reset the data hold latch 18 and thus preventing the latch being in a metastable state. Although data hold latch 18 is shown as including a NAND gate and an AOI gate, data hold latch 18 may be implemented using two cross-coupled NAND gates, as well.

In terms of the operation of data hold latch 18, an exemplary purpose of the cross-coupled P-channel transistors 82 and 84 is to maintain the inactive global data line (GDL or $\overline{GDL}$) to full rail of the VDD voltage during the high-to-low transition of its counterpart. As shown in FIG. 4, the true global data line GDL is coupled to one input of NAND gate 86 and the output of NAND gate 86 drives the final driver stage and is coupled to an input of AOI gate 88. The complementary global data line $\overline{GDL}$ is coupled to the other input of AOI gate 88 and the output of AOI gate 88 is coupled to the other input of NAND gate 86. In sum, the NAND-AOI gate pair forms a set-reset (SR) type of latch. When the true global data line GDL goes from high to low, the output of NAND gate 86 will go high and remain latched high after the true global data line GDL is pre-charged back to high due to the feedback of AOI gate 88. When the complementary global data line $\overline{GDL}$ goes from high to low, the output (Q) of data hold latch 18 will go high and remain latched high after the complementary global data line $\overline{GDL}$ is pre-charged back to high. Thus, data hold latch 18 requires no independent control signals, and simply responds to new data states driven on the global data lines. Another advantage of the cross-coupled NAND-AOI configuration is the elimination of signal contention when changing data states.

Figure 5:
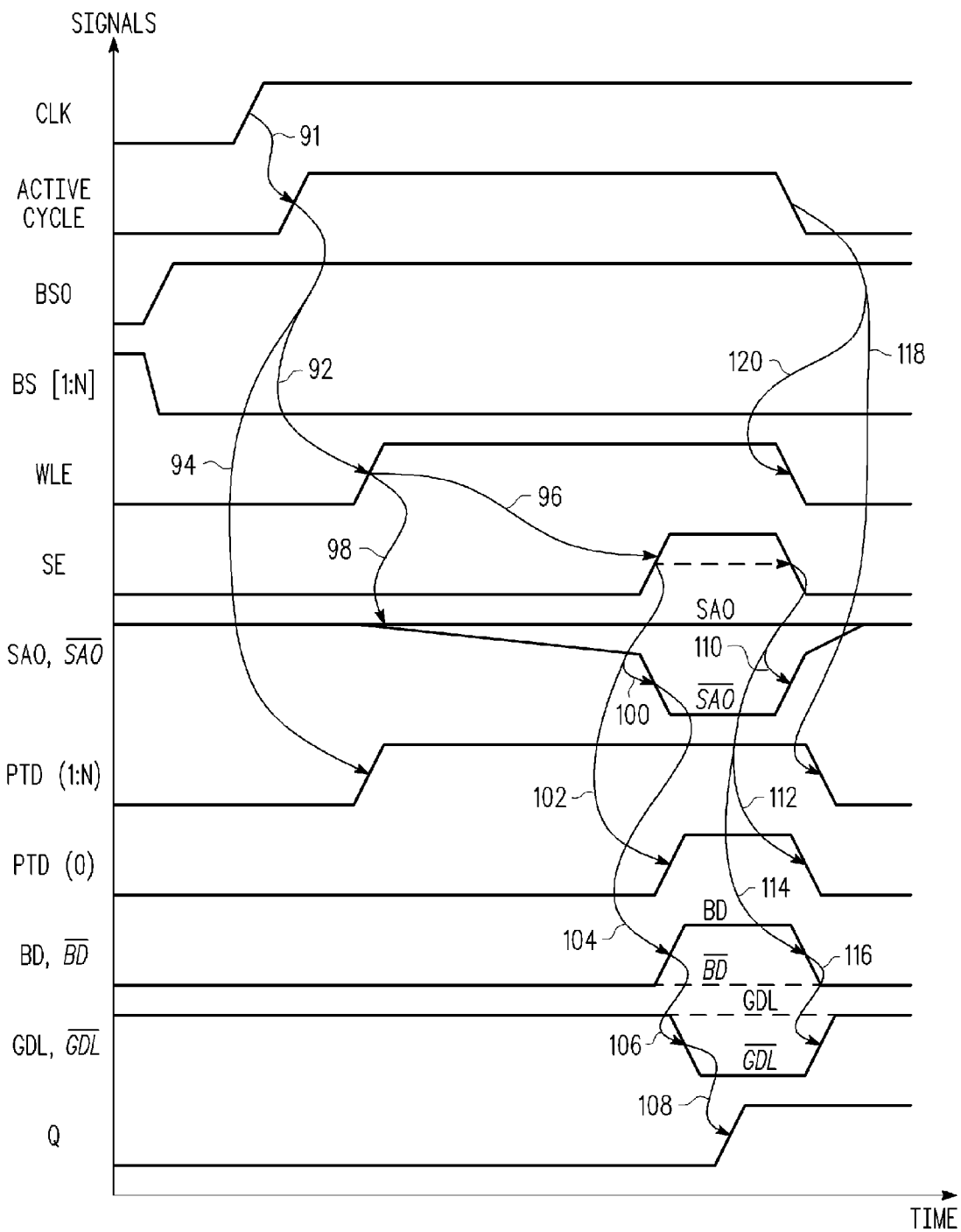
FIG. 5 is an exemplary timing diagram for the multiple block memory of FIG. 1.

The details of the operation of multiple block memory 10 are discussed with respect to FIG. 5, which is an exemplary timing diagram for the multiple block memory of FIG. 1. In operation, at the beginning of each data cycle, data lines GDL and $\overline{GDL}$ are pre-charged high by the tri-drivers coupled to the sense amplifiers, all sense amplifiers are disabled, and all block select signals (BS0, BS1, and BSN) are gated to be inactive at local sense blocks by the ACTIVE CYCLE signal. In general, for any sensing operation, only one array block can be active, while other array blocks remain inactive. In general, during a read cycle, a P-channel tri-driver signal (PTD), as shown in FIG. 3 is activated for all the inactive array blocks. The PTD signal causes the P-channel transistors driving the data lines of the inactive array blocks to turn-off. Since all the N-channel transistors in the tri-drivers are already off, all of the drivers of the inactive array blocks become tri-stated, or, in other words have a high-impedance. The P-channel transistors corresponding to the active array block, however, stay turned on, and thus in turn maintain a logic high state on the data lines. FIG. 5 illustrates the operation of multiple block memory 10 by assuming that array block 0 12 is the active block and the remaining blocks are inactive. As shown by reference number 91, in response to a rising edge of a clock CLK, an ACTIVE CYCLE signal for multiple block memory 10 initiates. Prior to the beginning of the ACTIVE CYCLE signal, block select signal BS [0], which corresponds to array block 0 is asserted, where as block select signals BS [1:N] are negated. As shown by reference number 92, the beginning of ACTIVE CYCLE signal results in the assertion of the word line enable WLE signal. The rising edge of the WLE signal in turn causes complementary sense enable signal $\overline{SE}$ to be asserted, as indicated by reference numeral 96. The complementary sense enable signal $\overline{SE}$ is typically asserted after a certain amount of delay to ensure that sufficient data line differential has been developed. The data line differential begins to develop subsequent to the assertion of the word line enable WLE signal, as indicated by reference numeral 98. The assertion of complementary sense enable signal $\overline{SE}$ turns on sense amplifier corresponding to array block 0. In addition to activating the sense amplifier, the complementary sense enable signal $\overline{SE}$ also turns off the remaining P-channel transistors holding the data lines to the voltage supply. The complementary sense enable signal $\overline{SE}$ when coupled with block select signal through NAND gate 58 also pulls up the P-channel tri-driver PTD signal corresponding to the selected array block, as shown by transition 102. As the sense amplifier outputs (SAO and $\overline{SAO}$) get pulled to rail-to-rail voltage, the data line signal pulled low drives the output of its respective NOR gate (buffered data BD or $\overline{BD}$) to logic high and turns on the corresponding N-channel transistor to discharge one of the data lines. For example, as shown in FIG. 5, as the sense amplifier output $\overline{SAO}$ changes from high to low, it turns off N-channel transistor 70 and turns on P-channel transistor 68 (shown in FIG. 3) to pull up buffered data BD signal high, as shown by reference number 104. The rising BD signal in turn pulls down the complementary global data line $\overline{GDL}$, as indicated by reference number 106. This in turns pulls up the data latch value Q, as shown by transition 108.

Further, as shown in FIG. 5, as the ACTIVE CYCLE signal terminates, the PTD signals corresponding to the un-selected array blocks is pulled low, as indicated by reference number 118. Moreover, the falling edge of the complementary sense enable signal $\overline{SE}$ pulls down the PTD signal corresponding to the selected block, as shown by reference numeral 112. The falling edge of the complementary sense enable signal $\overline{SE}$ also pulls down the buffer data BD signal, as indicted by reference numeral 114, which in turns pulls up the complementary global data line $\overline{GDL}$, as shown by reference numeral 116. This results in the pre-charging of the complementary global data line $\overline{GDL}$. During the pre-charging period, PTD signals corresponding to the inactive blocks are activated to allow the P-channel transistors 74 and 78 to turn on and thus assist with the pre-charging of the global data lines. Moreover, since critical speed path corresponds to the active-low transition of the global data lines, the N-channel transistors of the tri-drivers can be sized relatively large compared to the P-channel transistors of the tri-drivers used for less critical timing function, i.e., pre-charging. Furthermore, since tri-drivers of the active block maintain continuous control of the global data lines, the timing constraints associated with the state of tri-drivers corresponding to the inactive blocks are less critical and are thus easier to comply with.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Some of the above embodiments, as applicable, may be implemented using a variety of different information processing blocks. For example, although FIG. 1 and the discussion thereof describe an exemplary information processing architecture, this exemplary architecture is presented merely to provide a useful reference in discussing various aspects of the invention. Of course, the description of the architecture has been simplified for purposes of discussion, and it is just one of many different types of appropriate architectures that may be used in accordance with the invention. Those skilled in the art will recognize that the boundaries between logic blocks are merely illustrative and that alternative embodiments may merge logic blocks or circuit elements or impose an alternate decomposition of functionality upon various logic blocks or circuit elements.

Thus, it is to be understood that the architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Also for example, in one embodiment, the illustrated elements of memory 10 are circuitry located on a single integrated circuit or within a same device. Also for example, memory 10 or portions thereof may be soft or code representations of physical circuitry or of logical representations convertible into physical circuitry. As such, memory 10 may be embodied in a hardware description language of any appropriate type.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The invention claimed is:

1. A memory, comprising:
   a first memory block;
   a second memory block;
   a data bus;
   a first sense amplifier coupled to the first memory block;
   a second sense amplifier coupled to the second memory block;
   a first circuit, coupled to the data bus and the first sense amplifier, that switches from precharging the data bus to providing data in response to a first sense enable signal when the first memory block is selected and wherein the first circuit is decoupled from the data bus in response to the first memory block being deselected; and
   a second circuit, coupled to the data bus and the second sense amplifier, that switches from precharging the data bus to providing data in response to a second sense enable signal when the second memory block is selected and is decoupled from the data bus in response to the second memory block being deselected.

2. The memory of claim 1, wherein the data bus has a true line and a complementary line.

3. The memory of claim 2 further comprising:
   a latch, coupled to the data bus that provides an output representative of data on the data bus.

4. The memory of claim 3, wherein:
   the first circuit has a first output and a second output that couple a positive power supply voltage to the true and complementary lines when precharging and that provide complementary data to the true and complementary lines when providing data; and
   the second circuit has a first output and a second output that couple the positive power supply voltage to the true and complementary lines when precharging and that provide complementary data to the true and complementary lines when providing data.

5. The memory of claim 4, further comprising:
   a first P channel transistor having a first current electrode coupled to the true line, a gate coupled to the complementary line, and a second current electrode for receiving the positive power supply voltage; and
   a second P channel transistor having a first current electrode coupled to the complementary line, a gate coupled to the true line, and a second current electrode for receiving the positive power supply voltage.

6. The memory of claim 4, wherein:
   the first sense amplifier amplifies complementary data from the first memory block; and
   the second sense amplifier amplifies complementary data from the second memory block.

7. The memory of claim 6 further comprising a memory control circuit that provides a first block select signal that when active selects the first memory block and a second block select signal that when active selects the second memory block.

8. The memory of claim 7 further comprising:
   a first block control circuit coupled to the memory control circuit that provides the first sense enable signal; and a second block control circuit coupled to the memory control circuit that provides the second sense enable signal.

9. The memory of claim 1 further comprising;
a third memory block;
a third sense amplifier coupled to the third memory block;
a third circuit coupled to the data bus and the third sense amplifier that switches from precharging the data bus to providing data in response to a third sense enable signal when the third memory block is selected and is decoupled from the data bus in response to the third memory block being deselected.

10. The memory of claim 2 further comprising:
a first P channel transistor having a first current electrode coupled to the true line, a gate coupled to the complementary line, and a second current electrode; and
a second P channel transistor having a first current electrode coupled to the complementary line, a gate coupled to the true line, and a second current electrode coupled to the second current electrode of the first P channel transistor.

11. A method of operating a memory having a data bus, a first memory block, a second memory block, a first sense amplifier coupled to the first memory block, a second sense amplifier coupled to the second memory block, a first circuit coupled between the first sense amplifier and the data bus, and a second circuit coupled between the second sense amplifier and the data bus, comprising:
precharging the data bus through the first and second circuit;
selecting the first memory block and deselecting the second memory block in response to a clock signal;
terminating precharging the data bus through second circuit while maintaining precharging of the data bus through first circuit; and
providing data from the first memory block to the data bus through the first circuit and terminating precharging of the data bus through the first circuit in response to a first sense enable signal.

12. The method of claim 11 further comprising:
precharging the data bus through the first and second circuit in response to an end of active cycle signal;
selecting the second memory block and deselecting the first memory block in response to the clock signal;
terminating precharging the data bus through first circuit while maintaining precharging of the data bus through second circuit; and
providing data from the second memory block to the data bus through the second circuit and terminating precharging of the data bus through the second circuit in response to a second sense enable signal.

13. The method of claim 11, wherein the step of precharging is further characterized by the data bus comprising a true line and a complementary line in which the true line and the complementary line are precharged to a positive voltage.

14. The method of claim 13, wherein the step of providing data is further characterized by providing complementary data by pulling down the voltage on one of the true and complementary lines through the first circuit while applying the positive voltage through a third circuit to the other of the true and complementary lines.

15. The method of claim 14 further comprising providing an output signal of the memory through a latch coupled to the true and complementary lines.

16. A memory, comprising:
a first memory block enabled in response to a first block select signal and having complementary outputs;
a second memory block enabled in response to a second block select signal and having complementary outputs;
a data bus having a true line and a complementary line;
a first sense amplifier coupled to the complementary outputs of the first memory block, having a clock input responsive to a first sense enable signal, and having complementary outputs;
a second sense amplifier coupled to complementary outputs of the second memory block, having a clock input responsive to a second sense enable signal, and having complementary outputs;
a first tri-driver coupled to the complementary outputs of the first sense amplifier, having a clock input responsive to the first sense enable signal, and having complementary outputs coupled to the data bus, wherein the first tri-driver performs a function selected from the group consisting of precharging the data bus, providing a high impedance to the data bus, and providing complementary data on the data bus; and
a second tri-driver coupled to the complementary outputs of the second sense amplifier, having a clock input responsive to the second sense enable signal, and having complementary outputs coupled to the data bus, wherein the second tri-driver performs a function selected from the group consisting of precharging the data bus, providing a high impedance to the data bus, and providing complementary data on the data bus.

17. The memory of claim 16 further comprising:
a first P channel transistor having a first current electrode coupled to the true line, a gate coupled to the complementary line, and a second current electrode for receiving the positive power supply voltage; and
a second P channel transistor having a first current electrode coupled to the complementary line, a gate coupled to the true line, and a second current electrode for receiving the positive power supply voltage.

18. The memory of claim 16 further comprising a latch coupled to the true and complementary lines that provides an output of the memory.

19. The memory of claim 16 further comprising:
a memory control circuit that provides the first block select signal, the second block select signal, and a clock signal.
a first block control circuit coupled to the memory control circuit that provides the first sense enable signal; and
a second block control circuit coupled to the memory control circuit that provides the second sense enable signal.

20. The memory of claim 16, wherein the first tri-driver provides complementary data by reducing a voltage on one of the true and complementary lines while providing a high impedance to the other of the true and complementary lines.

* * * * *